(12) United States Patent
Ma et al.

(10) Patent No.: US 6,445,106 B1
(45) Date of Patent: Sep. 3, 2002

(54) MICRO-ELECTROMECHANICAL STRUCTURE RESONATOR, METHOD OF MAKING, AND METHOD OF USING

(75) Inventors: Qing Ma, San Jose; Peng Cheng, Campbell, both of CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/507,228

(22) Filed: Feb. 18, 2000

(51) Int. Cl.$^7$ ................................................. G11B 9/00
(52) U.S. Cl. ........................................................ 310/309
(58) Field of Search ......................................... 310/309

(56) References Cited

U.S. PATENT DOCUMENTS

| | | | | |
|---|---|---|---|---|
| 4,614,119 A | * | 9/1986 | Zavracky et al. | 216/2 |
| 4,764,244 A | * | 8/1988 | Chitty et al. | 216/20 |
| 5,061,049 A | | 10/1991 | Hornbeck | 359/224 |
| 5,417,115 A | * | 5/1995 | Burns | 331/156 |
| 5,572,174 A | | 11/1996 | Kitaichi et al. | 333/206 |
| 5,589,082 A | * | 12/1996 | Lin et al. | 216/11 |
| 5,808,210 A | * | 9/1998 | Herb et al. | 73/704 |
| 6,249,073 B1 | | 6/2001 | Nguyen et al. | 310/309 |
| 6,269,698 B1 | * | 8/2001 | Woodruff | 73/514.29 |

FOREIGN PATENT DOCUMENTS

| | | | | |
|---|---|---|---|---|
| EP | 0368579 | | 5/1990 | G01N/27/00 |
| EP | 0472342 | | 2/1992 | G11B/5/592 |
| EP | 0665541 | | 8/1995 | G11B/11/00 |
| JP | 60-180203 | | 9/1985 | H01P/7/10 |
| JP | 63-299605 | | 12/1988 | H01P/11/00 |
| JP | 2-136408 | | 5/1990 | E01F/8/00 |
| JP | 8-222911 | | 8/1996 | H01P/1/205 |
| WO | PCT/US93/03179 | * | 10/1993 | G01P/15/08 |
| WO | WO 93/21536 | | 10/1993 | G01P/15/08 |
| WO | PCT/US97/20639 | * | 7/1998 | H03H/9/24 |
| WO | WO 98/29943 | | 7/1998 | H03H/9/24 |

OTHER PUBLICATIONS

Suminto, J.T., "A Wide Frequency Range, Rugged Silicon Micro Accelerometer with Overrange Stops", IEEE, Feb. 11, 1996, pp. 180–185, vol. Workshop 9.

Fujita, T. Et Al., "Design of Two–Dimensional Micromachined Gyroscope by Using Nickel Electroplating", Sensors & Actuators A, Apr. 1, 1998, pp. 173–177, vol. 66.

International Search report PCT/US01/02203.

* cited by examiner

Primary Examiner—Thomas M. Dougherty
(74) Attorney, Agent, or Firm—Blakley Sokoloff Taylor & Zafman LLP (57) ABSTRACT

The invention relates to a hollow microbeam that is fabricated upon a base or pedestal. Processing of the hollow microbeam includes forming at least one hollow channel in the microbeam by removing temporary fillers after formation of the microbeam. The inventive microbeam may provide at least an order of magnitude increase in oscillational frequency over a solid microbeam.

8 Claims, 9 Drawing Sheets

MICRO-ELECTROMECHANICAL STRUCTURE RESONATOR, METHOD OF MAKING, AND METHOD OF USING

BACKGROUND OF THE INVENTION

1. Field of the Invention

The present invention relates generally to microelectromechanical structure (MEMS) fabrication and, more specifically, the present invention relates to the fabrication of an ultra-high frequency beam resonator.

2. Description of Related Art

As microelectronic technology progresses, the need has arisen in the wireless communication area for smaller and higher frequency resonators for both signal filtering and signal generating purposes. The prior state of the art used discrete crystals or devices that generate a surface acoustical wave (SAW) for their desired functions. As miniaturization of devices progresses, the discrete crystals and SAW generating devices become relatively larger and therefore much more difficult to package. For example, discrete devices limit the size of the overall system to larger configurations and they are more expensive to produce and to install.

In data storage technology, the speed of data writing and data access has been limited to prior state of the art devices. With the pressure in the industry to push the microprocessors to higher clock speeds, pressure was also felt in the data access and storage technology. One of the limiting factors is the resonance frequency of the read/write head for some devices. Additionally, relatively long access times cause a hindrance to increased performance of devices used in this field. In the prior art, there has been no foreseeable solution to achieving faster MEMS based storage.

What is needed is a MEMS resonator that overcomes the problems in the prior art by offering, among other things, a higher resonance frequency.

BRIEF DESCRIPTION OF THE DRAWINGS

In order that the manner in which the above-recited and other advantages of the invention are obtained, a more particular description of the invention briefly described above will be rendered by reference to specific embodiments thereof which are illustrated in the appended drawings. Understanding that these drawings depict only typical embodiments of the invention that are not necessarily drawn to scale and are not therefore to be considered to be limiting of its scope, the invention will be described and explained with additional specificity and detail through the use of the accompanying drawings in which.

DETAILED DESCRIPTION OF THE INVENTION

The following description includes terms, such as upper, lower, first, second, etc. that are used for descriptive purposes only and are not to be construed as limiting. The embodiments of an apparatus or article of the present invention described herein can be manufactured, used, or shipped in a number of positions and orientations.

Reference will now be made to the drawings wherein like structures will be provided with like reference designations. In order to show the structures of the present invention most clearly, the drawings included herein are diagrammatic representations of integrated circuit structures. Thus, the actual appearance of the fabricated structures, for example in a photomicrograph, may appear different while still incorporating the essential structures of the present invention. Moreover, the drawings show only the structures necessary to understand the present invention. Additional structures known in the art have not been included to maintain the clarity of the drawings.

Figure 1A:
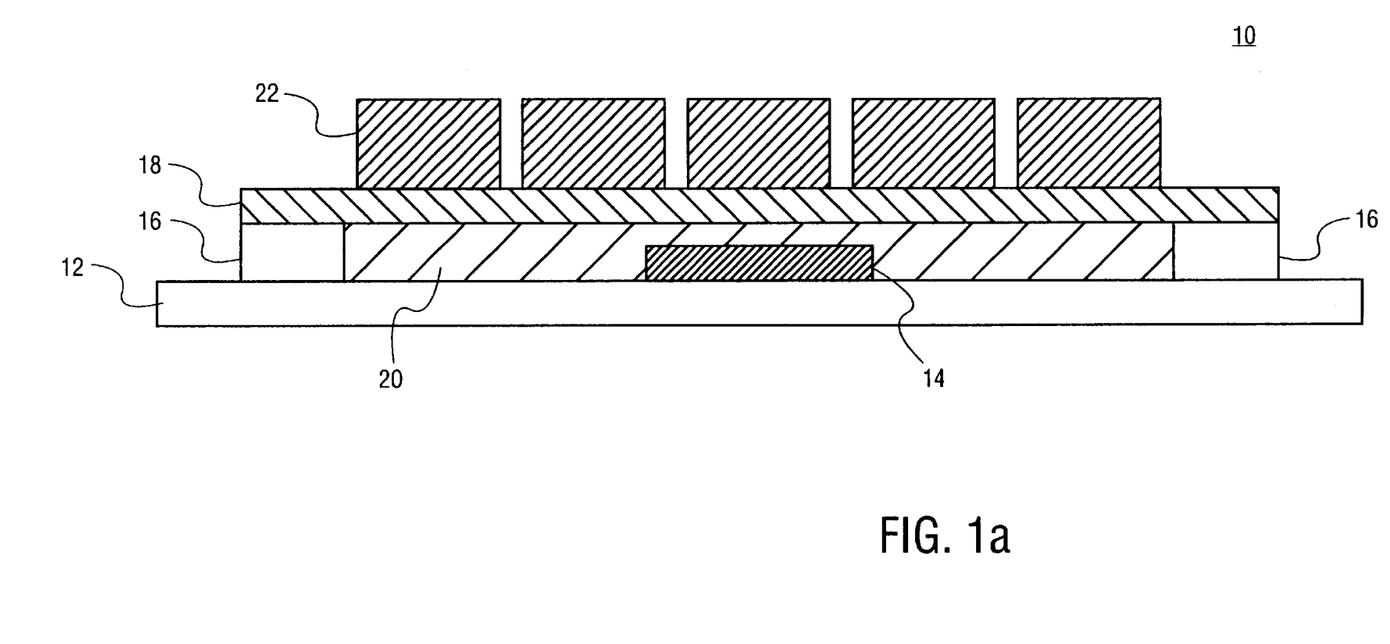
FIG. 1a is an elevational cross-section view that depicts preliminary fabrication of a hollow MEMS resonator beam according to the present invention.

FIG. 1a is an elevational cross-section view that illustrates fabrication of a MEMS resonator according to the present invention. FIG. 1a illustrates a MEMS 10 that includes a substrate 12 upon which the resonator beam is to be situated. A base such as a pedestal 16 has been patterned upon which the resonator beam is to be attached. Upon substrate 12, a drive electrode 14 has been patterned to provide the driving force to the resonator beam.

A first fabrication stage of the resonator beam is the formation of a resonator lower section 18. Resonator lower section 18 may comprise an electrically conductive material. One example of an electrically conductive material is polysilicon, selected from undoped polysilicon and doped polysilicon, either p-doped or n-doped. Another example of an electrically conductive material is a metal such as metals that are typically used in the fabrication of metallization layers. The metal may be selected from aluminum, copper, silver, gold, and the like. The metal may also be selected from titanium, niobium, zirconium, hafnium, and the like. The metal may also be selected from tungsten, cobalt, nickel, scandium and others known in the art. Another example of an electrically conductive material is refractory metal nitrides selected from titanium nitride, tungsten nitride, aluminum nitride, and the like.

Resonator lower section 18 is patterned upon pedestal 16 by providing a temporary bulk filler 20 upon substrate 12 abutting between pedestals 16 and upon drive electrode 14 up to the top of pedestal 16. Next, a series of temporary spacer filers 22 is patterned upon resonator base 18. Temporary bulk filler 20 and temporary spacer fillers 22 are to be removed after further fabrication of the resonator beam. Temporary bulk filler 20 may be removed immediately after formation of resonator lower section 18, but it is preferably removed later in the process.

Figure 1B:
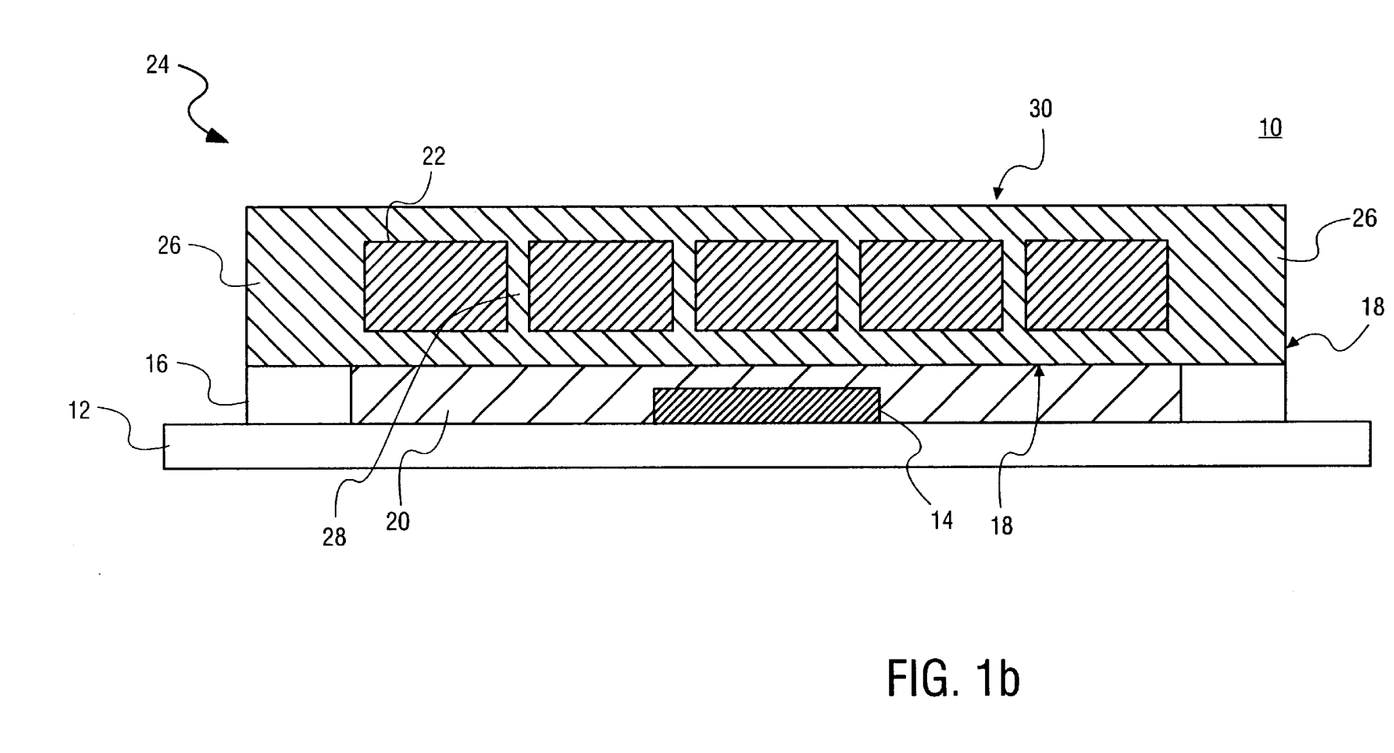
FIG. 1b is an elevational cross-section view of the resonator beam structure depicted in FIG. 1a after further processing to achieve a temporarily filled beam for fabrication purposes.

FIG. 1b is an elevational cross-section view of the resonator beam structure depicted in FIG. 1a after further processing to achieve a temporarily filled beam for fabrication purposes. As depicted, a bridge resonator 24 that has temporary spacer fillers 22 therein has been formed by further deposition of resonator material to include an external wall 26, at least one internal wall 28, and a resonator upper section 30. As a whole, resonator lower section 18, exterior walls 26, internal walls 28, and resonator upper section 30 comprise bridge resonator 24.

After the formation of bridge resonator 24, and preferably before the removal of both the temporary bulk filler 20 and temporary spacer fillers 22, the MEMS 10 may be treated to make the resonator structure an integral unit. Preferably, treatment is a rapid thermal process (RTP) such a heating in an inert environment over a temperature increase range from about 100° C. to about 2,000° C. and for a process time from about 10 seconds to about 5 minutes. In order to provide a microfine-grained, substantially homogenous polysilicon resonator structure that will resist disintegration during field use, it is preferable to use a polysilicon composition that has a grain size in a range from about 0.1 micron to about 10 micron and an aspect ratio from about 1:1 to about 4:1, preferably from about 1.1:1 to about 2:1. Preferably, the polysilicon is doped by implanting doping elements at the borders between individual homogenous phases of the polysilicon. Where bridge resonator 24 is made of a metal, fabrication is preferably carried out by collimated sputtering where the collimator dimensions are about symmetrical to internal wall 28.

Figure 1C:
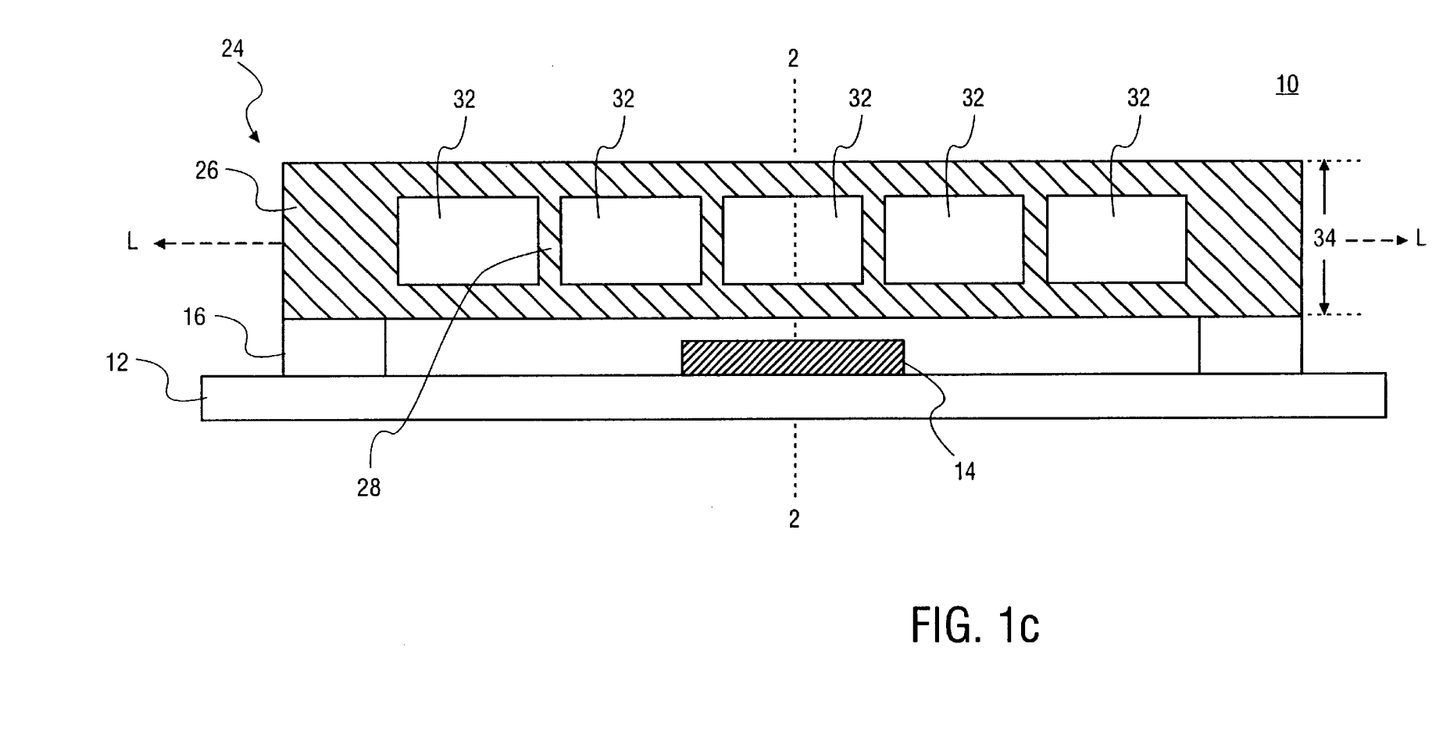
FIG. 1c illustrates further processing of the resonator beam structure depicted in FIG. 1b, wherein the temporary filler has been removed.

FIG. 1c illustrates MEMS 10 after further processing in which temporary bulk filler 20 and temporary spacer fillers 22 have been removed. The removal process(es) is done by isotropic etching, preferably by wet etching. Etch selectivity in the preferable isotropic wet etch(es) is configured to make the etch recipe(s) more selective to substrate 12, drive electrode 14, and pedestal 16, than to temporary filler material(s). The etch recipe selectivity is above about 20:1, preferably below about 100:1, more preferably below about 1000:1, and most preferably below about 5000:1. After the removal process(es), it is observed that bridge resonator 24 is disposed adjacent to drive electrode 14. It is further observed that resonator 24 has a length comprising a longitudinal axis L—L, and wherein drive electrode 14 may be disposed symmetrical to beam 24 and orthogonal to longitudinal axis L—L.

Figure 2:
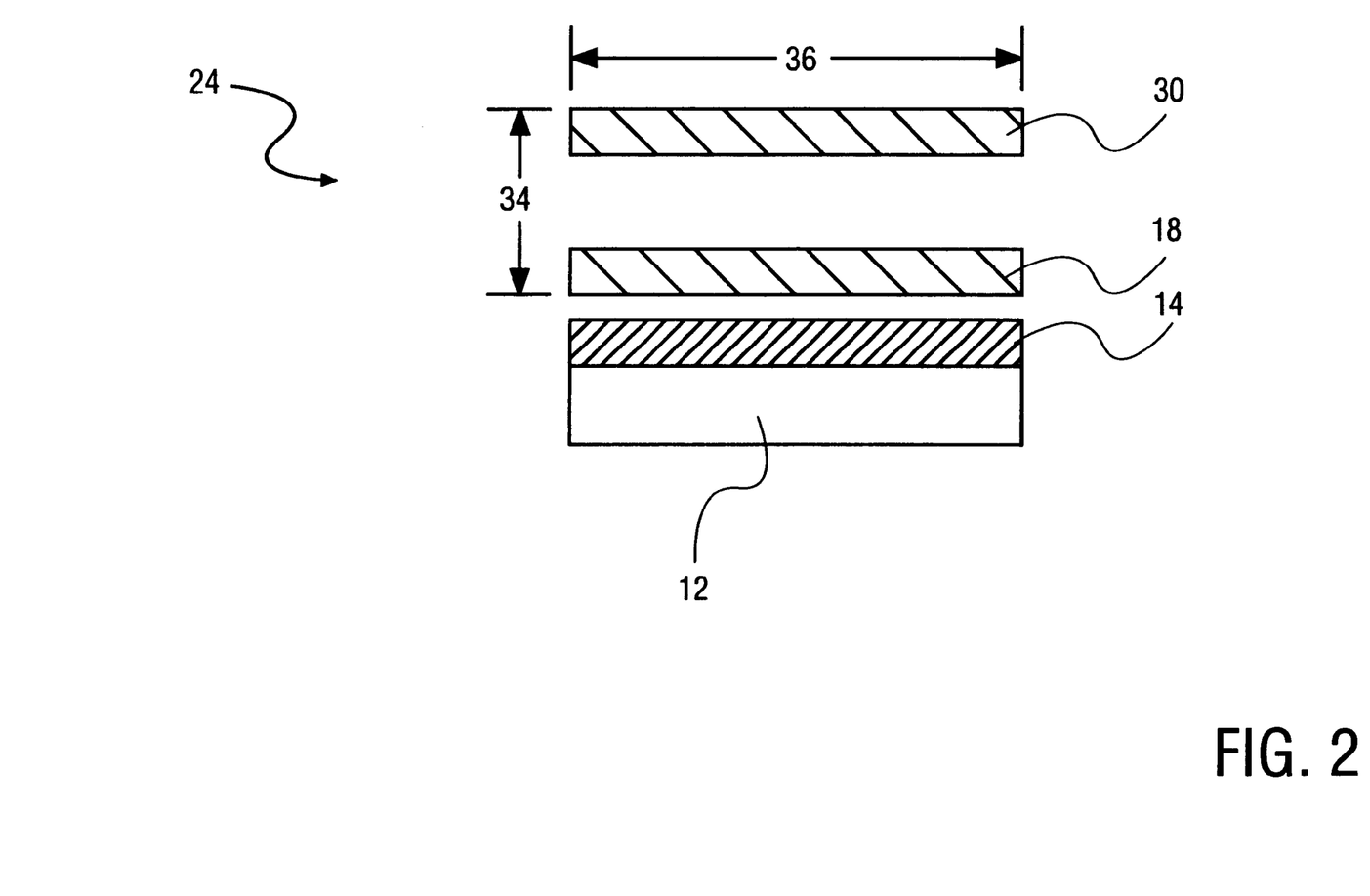
FIG. 2 is an elevational cross-section view of the resonator beam depicted in FIG. 1c that illustrates the mass difference between the inventive resonator and prior art resonators based upon bulk cross sectional area.

In FIG. 1c, bridge resonator 24 has been finished by the removal of temporary bulk and filler spacers that have allowed bridge resonator 24 to form at least one hollow channel 32. Hollow channel 32 lowers the total mass of bridge resonator 24 compared to a solid beam resonator with the same bulk cross-sectional area. FIG. 2 is an elevational cross-section view of MEMS 10 taken along the section line 2—2 from FIG. 1c. FIG. 2 illustrates bulk cross-sectional area of bridge resonator 24 as the top-to-bottom thickness 34 thereof, multiplied by the bridge width 36. The resonant frequency can be increased because the amount of mass in bridge resonator 24 is a fraction of the mass of a solid resonator with the same bulk cross-sectional area. The fraction of the mass of a hollow resonator is below about 90% as much mass of a solid resonator with the same bulk cross-sectional area, preferably below about 70%, more preferably below about 50%, and most preferably below about 30%.

The resonant frequency of a beam, bridge or a plate/membrane is $$\omega = \alpha \sqrt{\frac{I}{M}} \quad (1)$$

where I is the moment of inertia per unit width and M is the mass per unit width. From Equation (1), it becomes clear that an increased I or a decreased M, or both, will increase the resonant frequency of resonator 22. Frequency is a function of both resonator stiffness and resonator mass.

According to the present invention, order of magnitude increases in frequency and stiffness can be achieved compared to a solid beam resonator with the same mass where the inventive hollow resonator beam is fabricated. As an example of stiffness increase, a structure like bridge resonator 24 may be considered to have a top-to-bottom thickness 34 of about one half micro meter (micron) thick each for lower and upper sections 18 and 30 respectively, and a channel that is about 2 micron therebetween. This structure will be about 20 times as stiff as a solid resonator with a top-to-bottom thickness 34 of about one micron. Consequently, the resonant frequency, according to equation (1) will be about four and one half times as great for bridge resonator 24. According to the present invention, the hollow beam resonators oscilliate in a frequency range that is from about greater than 1-fold to about 10-fold the oscillation of a solid microbeam with an equivalent mass.

Figure 1D:
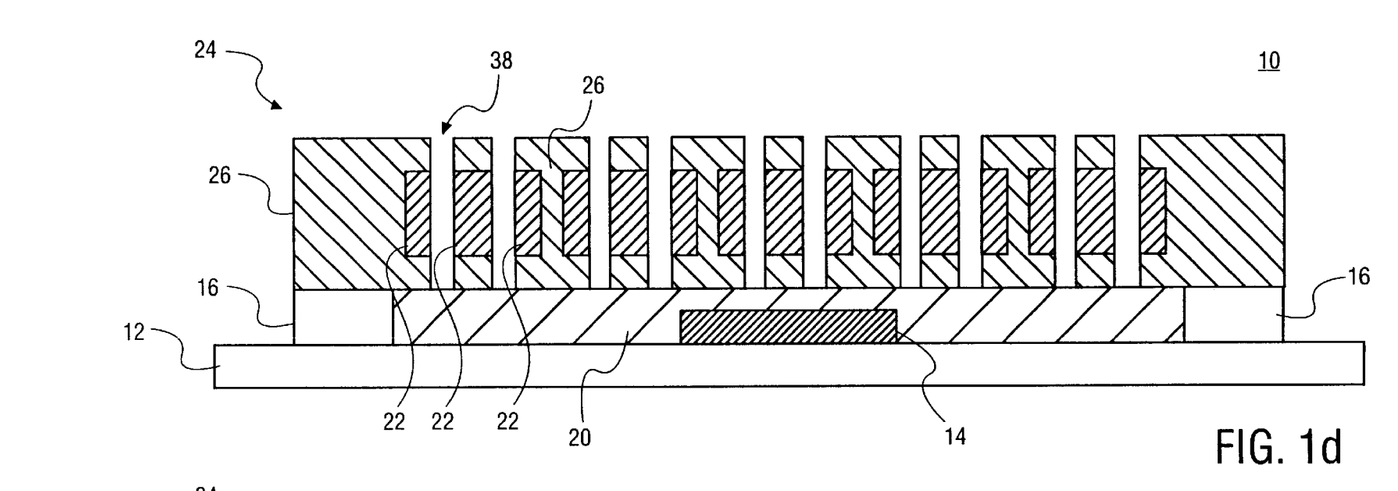
FIG. 1d illustrates alternative processing of the resonator beam structure taken along the section line 1d—1d in FIG. 3, wherein etch through-holes are formed to facilitate removal of the temporary filler material.
Figure 3:
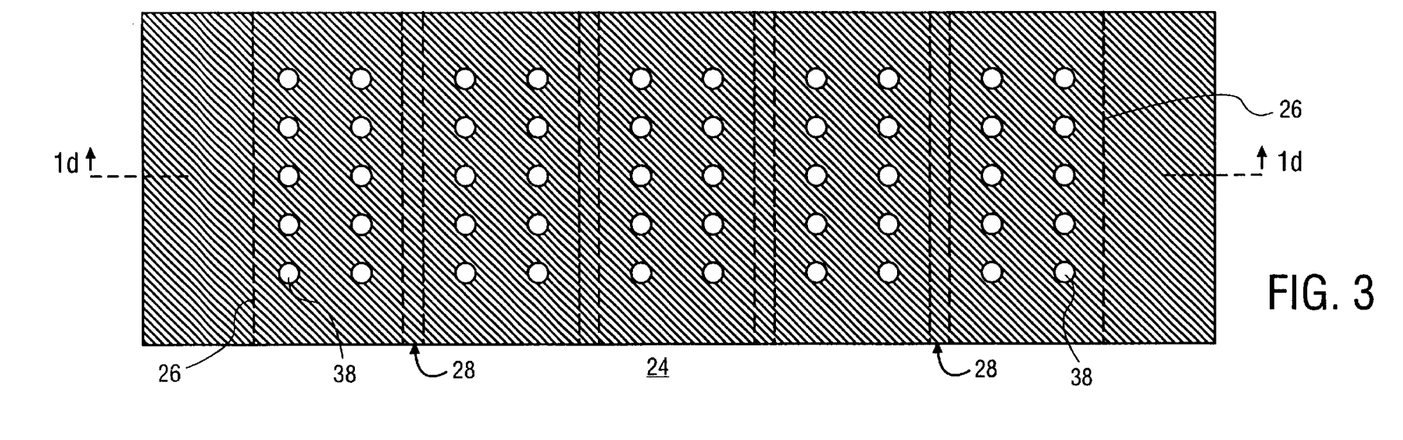
FIG. 3 is a top view of the resonator beam structure wherein etch through holes are depicted.

FIG. 1d illustrates alternative processing of MEMS 10 taken along the section line 1d—1d in FIG. 3. In FIG. 1d, etch through-holes 38 are formed to facilitate removal of the temporary fillers 20 and 22. Etch through-holes 38 are preferably formed by anisotropic dry etching. Preferably and alternatively, because resonator lower section 18 may be formed upon temporary bulk filler 20 that covers drive electrode 14 and substrate 12 abutting between pedestals 16, etch through holes 38 may also penetrate temporary bulk filler 20 to any depth down to as far as stopping upon either substrate 12 or upon drive electrode 14. This penetration depth alternative facilitates the removal of temporary bulk filler 20 simultaneously with temporary spacer fillers 22 in a single isotropic wet etch.

Figure 1E:
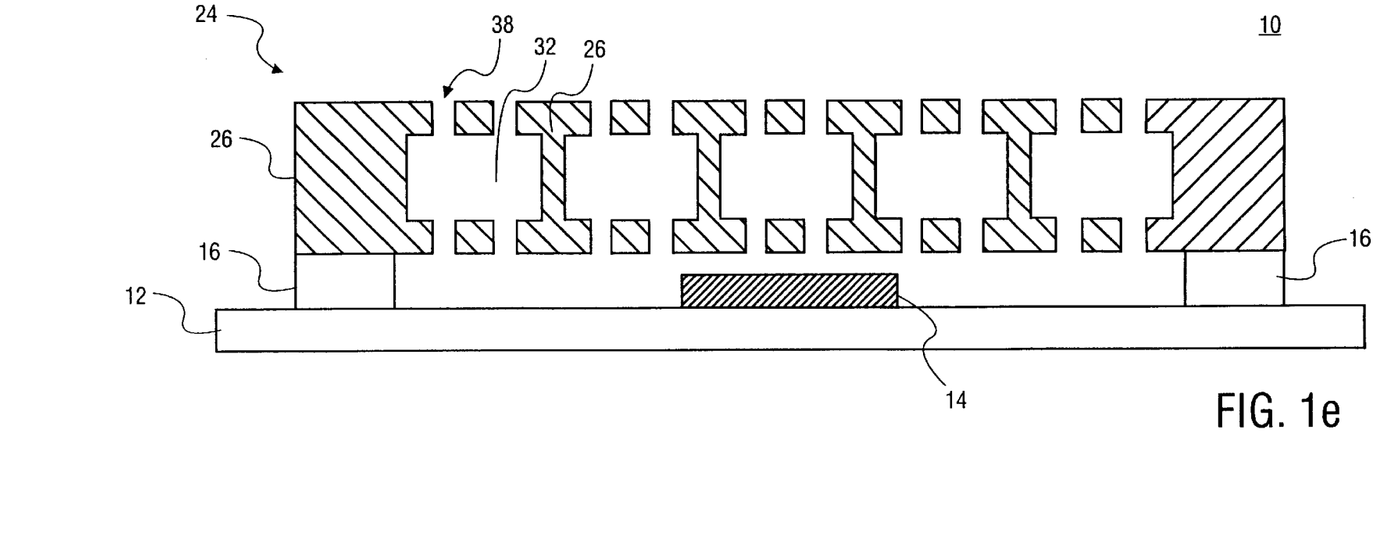
FIG. 1e illustrates further alternative processing of the resonator beam structure depicted in FIG. 1d, wherein the temporary filler material has been removed.

FIG. 1e illustrates further processing of MEMS 10 depicted in FIG. 1d, wherein the temporary filler materials have been removed. Where the oscillation of bridge resonator 24 may be in part dependent upon the surface area of resonator lower section 18 that is presented immediately adjacent drive electrode 14, the presence of etch through holes 38 in this region may be eliminated.

FIG. 3 is a top view of bridge resonator 24 wherein etch through holes 38, external walls 26, and internal walls 28 are depicted in phantom lines. Etch through-holes 38 may be configured in any suitable pattern. In FIG. 3, etch through-holes 38 are configured in double column rows on a square pitch, between structures such as external wall 26 and internal wall 28, or between two internal walls 28. Other patterns may be selected according to a specific embodiment including single column, triangular pitch, face-centered cubic, and the like.

Figure 4:
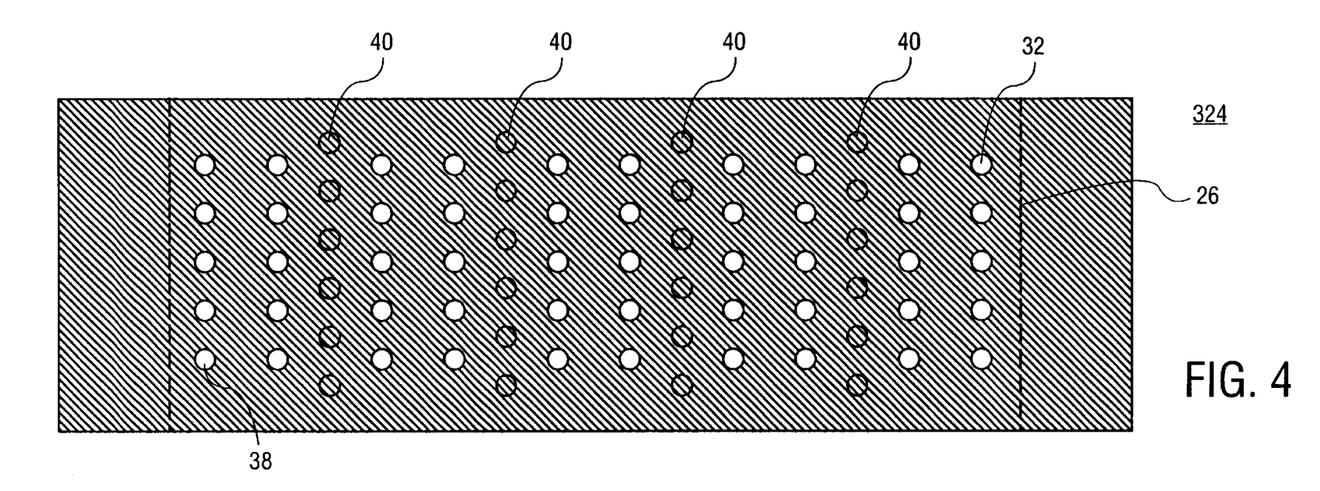
FIG. 4 is a top view of an alternative embodiment of the resonator beam structure depicted in FIG. 2, wherein etch through-holes are depicted, and wherein the mass of the resonator beam structure is reduced by the placement of internal posts in lieu of internal walls.

During the fabrication of bridge resonator 24, even less mass may be built into the resonator than what is depicted in FIGS. 1a–3. FIG. 4 is a top view of an alternative embodiment of an inventive bridge resonator 324. Etch through-holes 38 are depicted, and the mass of bridge resonator 324 is reduced compared to bridge resonator 24 by the formation of internal posts 40 in lieu of internal walls 26, depicted in FIGS. 1b–1e and in FIG. 3. Although internal posts 40 are arrayed in right columns, in FIG. 4 as four columns of six posts each, it is understood that other internal post configurations may be accomplished including non-square pitch configuration as set for above such as the configuration patterns for etch though holes 38.

Figure 5:
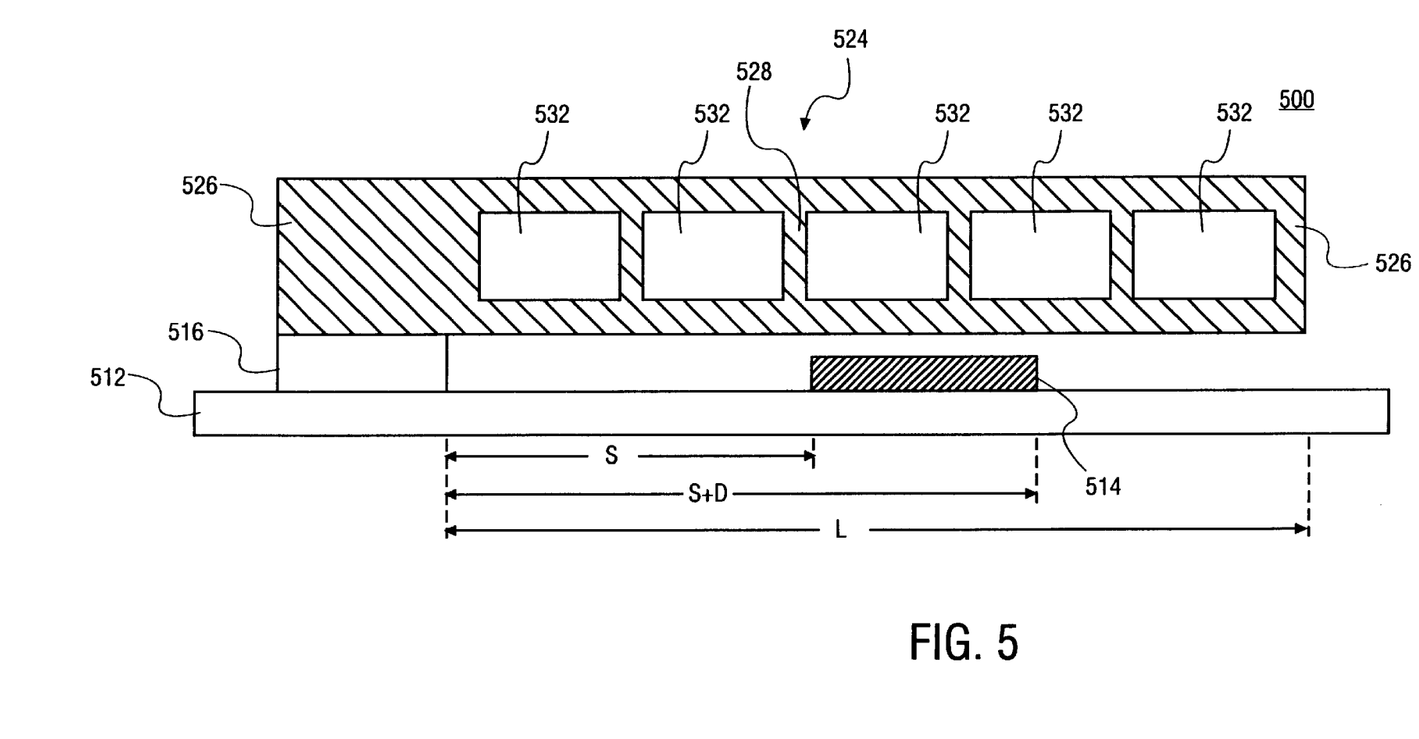
FIG. 5 is an elevational cross-section view of a cantilever resonator beam structure that is another embodiment of the invention.

In some embodiments, a cantilever MEMS 500 may provide resonator qualities that are preferred over a bridge MEMS 10. FIG. 5 is an elevational cross-section view of a hollow cantilever resonator 524 that is another embodiment of the invention. Cantilever resonator 524 is constructed similarly to bridge resonator 24 depicted in FIGS. 1a–1e. Because a hollow cantilever may vibrate differently from a hollow bridge, cantilever resonator 524 may have operational qualities that differ from bridge resonator 24.

Figure 6:
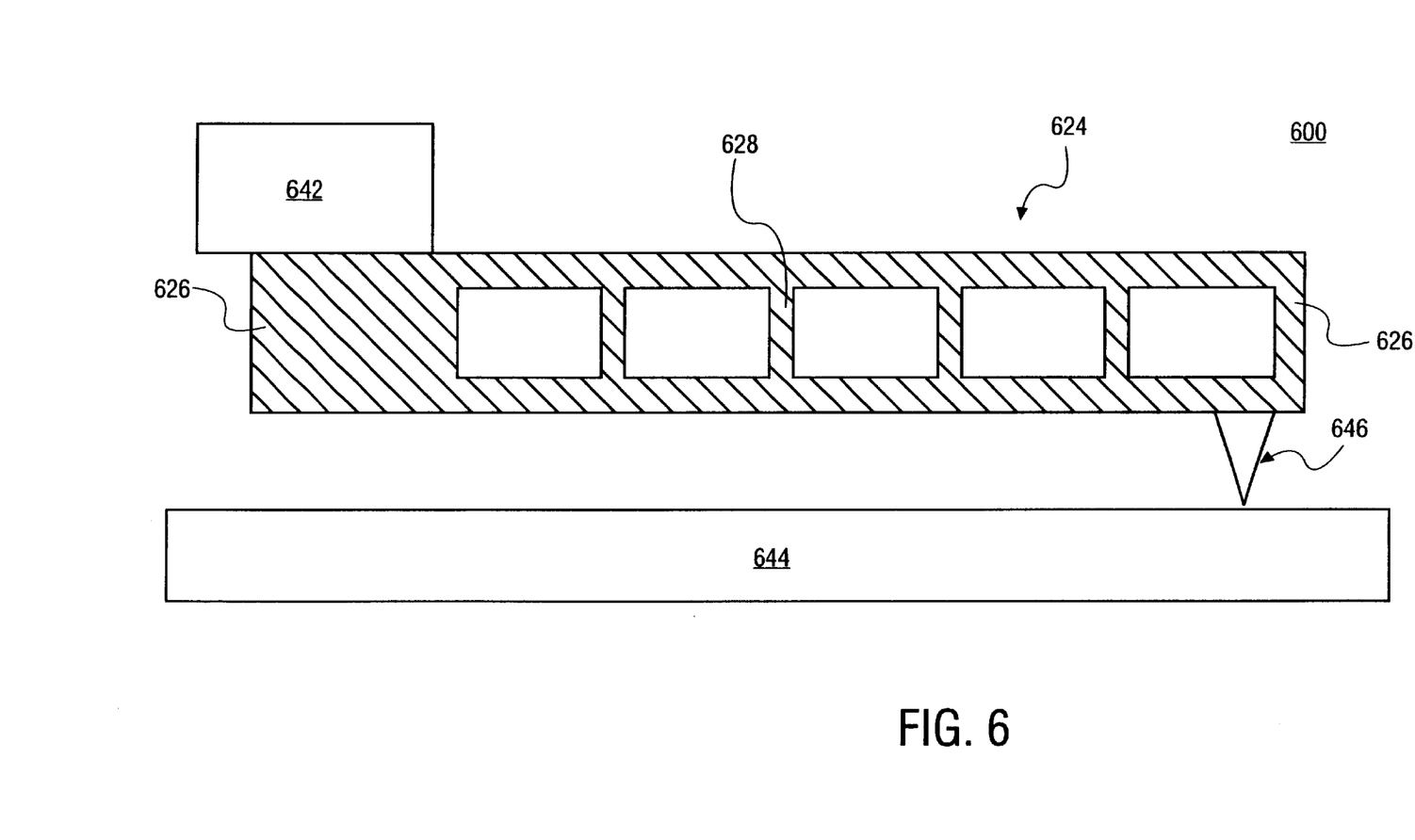
FIG. 6 is an elevational cross-section view of a cantilever resonator beam structure according to another embodiment of the present invention that is part of a read/write device.

FIG. 6 is an elevational cross-section view of a cantilever resonator beam structure according to another embodiment of the present invention that is part of a read/write device 600. A cantilever resonator 624 is suspended from a base 642 above a read/write medium 644 such as a magnetic disk, or the like. A read/write tip 646 is suspended from cantilever resonator 624. The present invention comprises writing and/or reading to read/write medium 644 at frequencies that are achievable by virtue of the hollow resonator structures as set forth herein. Although no drive electrode is depicted in the structure in FIG. 6, it is understood that the same or a similiar means according to what is set forth in this disclosure may carry out oscilliation of cantilever resonator 624.

Figure 7:
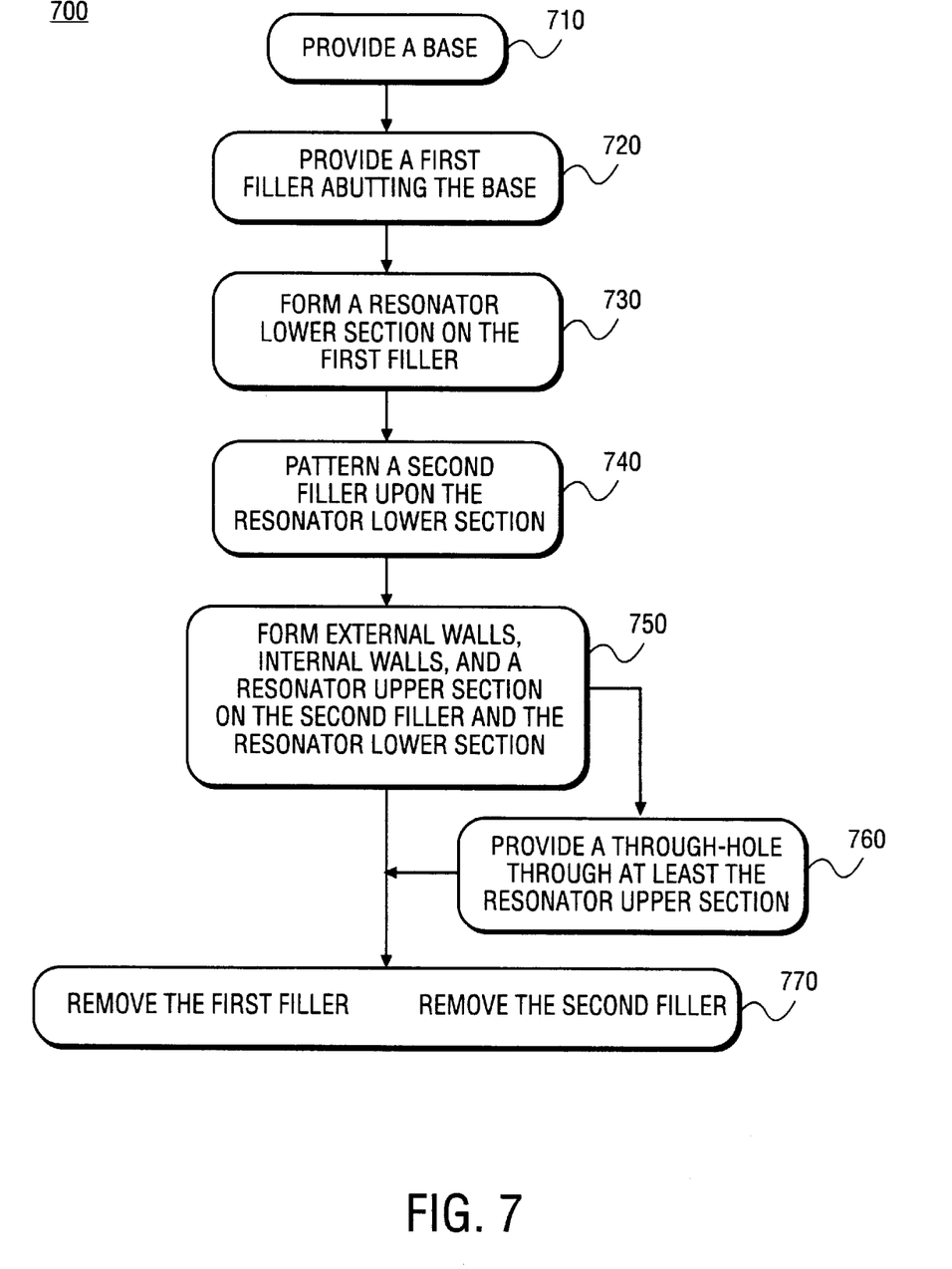
FIG. 7 is a process flow diagram that illustrates one embodiment of the present invention.

The inventive resonator in summary is made according to an inventive method that is illustrated in FIG. 7. The method 700 of making a resonator comprises providing a substrate and a base upon the substrate as depicted in block 710. Where the resonator is to be a bridge, the base comprises two pedestals. Where the resonator is to be a cantilever, the base is one pedestal. Where the resonator is to be a read/write device, the base is a single pedestal as illustrated in FIG. 6. A first filler is provided upon the substrate and abutting the base as depicted in block 720. This first filler is typically the temporary bulk filler. A resonator lower section is formed upon the base and the first filler as depicted in block 730. A second filler is patterned upon the resonator lower section in the form of spacers as illustrated in block 740. The remainder of the resonator beam is formed by depositing walls and the resonator upper section as depicted in block 750. Solidification of the resonator beam may be carried out by heat treatment as set forth above. Depending upon the specific materials and processing conditions used for the resonator beam, solidification thereof may be omitted. Removal of filler material may be facilitated by formation of through-holes in the resonator upper section and optionally in the resonator lower section where appropriate as illustrated in block 960. Solidification heat treatment may precede or follow block 760. Finally, as illustrated in block 770, fillers are removed. Typically, a drive electrode is formed immediately following or immediately prior to forming a base.

The inventive resonator is typically placed in an electronic device such as a wireless device. Such wireless devices may include a personal data assistant (PDA), a cellular telephone, a notebook computer, and the like. The inventive resonator is also typically placed in an electronic device such as a storage device including a magnetic storage device and the like.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A resonator comprising:

a drive electrode; and a beam disposed adjacent the drive electrode, wherein the beam comprises:

an exterior wall;

an interior wall; and a channel between the exterior wall and the interior wall.

2. The resonator according to claim 1, wherein the beam comprises a length, a width, and a height, and wherein the beam has a volume that is a fraction of said length multiplied by said width and said height.

3. The resonator according to claim 1, wherein the beam comprises a length, a width, and a height, and wherein the beam has a volume that is about less than a 0.9 fraction of said length multiplied by said width and said height.

4. The resonator according to claim 1, wherein the beam comprises a length, a width, and a height, and wherein the beam has a volume that is about less than a 0.3 fraction of said length multiplied by said width and said height.

5. The resonator according to claim 1, wherein the beam comprises a length having a longitudinal axis, and wherein the drive electrode is disposed symmetrical to the beam and orthogonal to the longitudinal axis.

6. The resonator according to claim 1, wherein the beam is a bridge that is disposed upon two pedestals.

7. The resonator according to claim 1, wherein the beam is a cantilever.

8. The resonator according to claim 1, wherein the beam comprises a length having a longitudinal axis, and wherein the internal wall is a series of posts that are arranged in rows that are orthogonal to the longitudinal axis.

\* \* \* \* \*

UNITED STATES PATENT AND TRADEMARK OFFICE
CERTIFICATE OF CORRECTION

PATENT NO.    : 6,445,106 B1
DATED         : September 3, 2002
INVENTOR(S)   : Ma et al.

It is certified that error appears in the above-identified patent and that said Letters Patent is hereby corrected as shown below:

Column 5,
Line 34, delete "similiar", insert -- similar --.
Line 34, delete "ossilliation", insert -- ossillation --.

Signed and Sealed this

Fourth Day of February, 2003

JAMES E. ROGAN
*Director of the United States Patent and Trademark Office*